Oct. 29, 1968 J. N. FORDEMWALT ETAL 3,407,479

ISOLATION OF SEMICONDUCTOR DEVICES

Filed June 28, 1965

INVENTORS
James N. Fordemwalt
Bernard van Pul

BY

Mueller, Aichele & Rauner

ATT'YS.

United States Patent Office 3,407,479
Patented Oct. 29, 1968

3,407,479

ISOLATION OF SEMICONDUCTOR DEVICES

James N. Fordemwalt, Mesa, and Bernard Van Pul, Phoenix, Ariz., assignors to Motorola, Inc., Franklin Park, Ill., a corporation of Illinois Filed June 28, 1965, Ser. No. 467,422
5 Claims. (Cl. 29—577)

ABSTRACT OF THE DISCLOSURE

Disclosed is a process for manufacturing a semiconductor sandwich structure having discrete semiconductor islands therein. A wafer is selectively etched to provide individual cavities therein, and thereafter a glass-containing mixture is applied to the etched surface of the wafer and fusion-bonded at elevated temperature between a supporting substrate and the wafer to thereby form an intermediate sandwich structure. Thereafter, the unmasked surface of the wafer is removed to a depth sufficient to expose portions of the glass and thereby provide semiconductor islands which are each surrounded by an insulating layer of glass.

Figure 1:
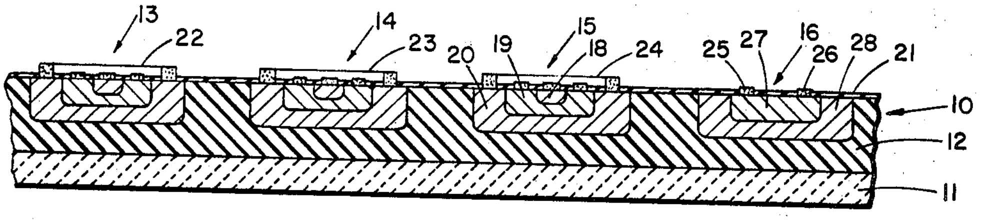

This invention relates to a new semiconductor structure, and more particularly to a novel integrated circuit structure having discrete semiconductor islands or regions which are electrically insulated and isolated from one another, and to a method of making such novel structures.

Monolithic integrated circuits normally have a number of active devices such as transistors and diodes formed in a single crystal semiconductor element, and passive devices such as resistors and capacitors also formed in or on the same semiconductor element. These devices are interconnected into a circuit by a pattern of metallization on an insulating film covering the surface of the semiconductor element. In order to avoid unwanted electrical interaction of the devices with each other, it is necessary to provide isolation between the active regions or islands of the structure.

Various means have been proposed to provide such isolation. For example, PN junctions fabricated in the semiconductor element between the active regions have been employed in some devices. However, leakage paths are still potentially available to the electrical current flowing through the devices. One potential leakage path is from one island to another via the substrate crystal, and a second such path is between devices via the epitaxial layer. Regardless of how the isolating PN junction is formed, parasitic capacitance is introduced into the circuit structure. Reduction of this capacitance is very desirable so that the operating or switching speed of the structure may be improved.

More recently, it has been proposed to isolate the semiconductor islands by an insulating layer such as an oxide layer between each of the islands and to surround the insulated islands by a substrate e.g. polycrystalline material. This subject matter is disclosed and claimed in application Ser. No. 440,421 filed Mar. 17, 1965, which is a continuation-in-part of application Ser. No. 363,802 filed Apr. 30, 1964, now abandoned.

It is an object of the present invention to provide improved isolation for semiconductor integrated circuit structures.

Another object of the invention is to provide a semiconductor structure of reduced parasitic capacitance, particularly that capacitance associated with isolation between active regions of the semiconductor element of an integrated circuit.

Another object of the invention is to provide a semiconductor structure with improved operating speed for switching circuits built into the structure.

A further object of the invention is to provide a simple method of manufacturing semiconductor integrated circuit structures having a high degree of isolation of the active regions of the circuit from each other.

Still another object of the invention is to provide an improved method of manufacturing semiconductor integrated circuit structures with greatly reduced parasitic capacitance between devices, which method can be conducted economically on a production scale.

A feature of the present invention is a semiconductor integrated cricuit structure in which isolation between discrete semiconductor islands or regions is accomplished by surrounding each island with a glass layer having thermal expansion characteristics substantially the same as said islands.

Another feature of the invention is a semiconductor integrated circuit structure in which the discrete semiconductor islands are both isolated from each other by the glass layer, and also are bonded by the glass to a common substrate, both the glass and the substrate having thermal expansion characteristics substantially the same as the islands.

The invention will be illustrated by the accompanying drawing in which;

FIGURE 1 is an enlarged cross-sectional view of an integrated circuit structure having isolating insulation, which structure constitutes one embodiment of the invention, and FIGURE 2 is a series of cross-sectional view illustrating an integrated circuit structure of the invention at different stages of its manufacture in accordance with the method of the invention.

The present invention is embodied in a semiconductor circuit structure including discrete single crystal semiconductor islands or regions, a plurality of which contain devices electrically isolated from other islands by a glass which surrounds each island and in addition, bonds each island to a common substrate. Both the glass and the substrate have thermal expansion characteristics substantially the same as the islands. Active devices are formed in the islands and joined to each other by electrical conductors.

The method of manufacturing semiconductor integrated circuit structures in accordance with the invention includes forming a masking pattern with openings on a surface of a semiconductor wafer and etching through the openings in the pattern into the wafer to provide cavities having an inside wall. A glass is applied to the etched surface of the wafer to fill the cavities and to form a coating over the surface thereof. A substrate is then bonded to the glass-coated surface of the wafer to form a laminate of the wafer, the glass and the substrate, all of which have substantially the same thermal expansion characteristics. The opposite exposed surface of the wafer is then removed to a depth sufficient to expose portions of the buried glass and thus provide semiconductor islands, each of which is surrounded by an isolating layer of glass over the sides and bottom thereof.

A starting material for the method of the invention is a single crystal semiconductor wafer. Advantageously, the wafer is a silicon wafer although other semiconductor materials such as germanium, etc., may be employed. The wafers are typically obtained from larger crystals which may be grown by known crystal pulling or zone melting processes. The larger crystal is sliced into wafers, and the wafers are ground, polished and otherwise processed to make their major faces smooth and substantially parallel to each other. The surface dimension of the wafers may be of any value and the thickness within a practical range, e.g., about 4 to 10 mils.

The masking pattern is formed on a surface of the wafer by conventional processes and may include the use of a commercial resist composition which is photosensitive and which polymerizes when exposed to light. For example, a pattern having a large number of repeated representations of the desired circuit is exposed onto the resist-coated surface of the wafer causing the exposed portions of the coating to polymerize and the unexposed portions to remain in a soluble condition. When the soluble portions are removed, the desired pattern of openings is formed on the surface of the wafer.

The wafer may be etched with a suitable etchant such as mineral acids. Advantageously, a mixture of nitric acid and hydrofluoric acid, that may contain also bromine or iodine, may be employed to etch a silicon wafer. Preferably, the etching pattern is designed so that the channels or cavities in the wafer, are of substantially equal cross section throughout the circuit structure.

After the etching has been completed, a glass having thermal expansion characteristics substantially the same as the semiconductor wafer is applied to the etched surface of the wafer, filling the cavities or channels etched into the wafer and forming a coating over the surface of the wafer. The term "glass" as used herein is intended to include various vitreous materials including glassy oxides, ceramics, etc. The glass is employed advantageously as a finely divided powder which preferably is applied as a mixture with a volatile diluent. The diluent employed is advantageously an organic material such as glycerol or a glycol. The glass advantageously is a silicate glass and preferably is formed from a major proportion of silicon dioxide and a minor proportion of aluminum oxide. Glasses, also including small quantities of one or more of the alkaline earth metal oxides such as barium, calcium and magnesium oxides are particularly useful.

The glass mixture advantageously is applied to a surface of the substrate as well as to a surface of the semiconductor wafer. Application of the glass may be accomplished by various procedures such as dusting the powder, brushing or spraying a suspension, preforming a glass wafer, applying a glass powder-coated tape, etc., and preferably by forcing the mixture through a silk screen onto the surface of the wafer and the substrate. A suitable mixture for application by silk screening may comprise 3 parts by weight of powdered glass (about 400 mesh) and 5 parts of glycerol.

After being coated with the glass mixture, the wafer and substrate are heated to vaporize and remove the diluent, and then the glass coated faces are combined and the combination heated to an elevated temperature to fuse the glass granules and form a continuous, substantially void-free, glass layer between the wafer and the substrate. The fusion of the glass advantageously is performed at a temperature above about 1000° C. in an oxygen-containing atmosphere which facilitates the fusion of the glass. Preferably, a fusion temperature in a range between about 1200° and 1400° C. is employed. The time required to accomplish the fusion of the glass will depend, to a large extent, upon the particular glass composition employed, and generally will be less than about 45 minutes and preferably between about 10 and 30 minutes.

The substrate as mentioned above, is a material having thermal expansion characteristics substantially the same as the single crystal islands. Examples of such substrates include glass, ceramics, cermets, etc.

Upon completing the fusion step, the combined wafer and substrate are removed from the heating chamber of the furnace and permitted to cool to room temperature. Advantageously, the cooling is accomplished relatively quickly without any annealing or other controlled cooling operations.

After the combination wafer-substrate has cooled to ambient temperature, the outer or exposed surface of the wafer is removed. This removal may be accomplished mechanically or chemically. If the removal is performed mechanically with the substrate mounted in contact with a support, it is important that the wafer-substrate combination be mounted so that the mechanical lapping or grinding operation will remove the outer surface of the wafer at a uniform rate. In this way, the depth of the wafer removed will be substantially the same over the entire surface. The removal operation is continued until the glass coating is exposed and advantageously until a substantially uniform thickness of glass surrounds each of the discrete islands present on the surface.

After the desired depth of the semiconductor wafer is removed, the circuit structure is ready for the fabrication of the desired circuit devices in the respective isolated islands. This may be accomplished by conventionally employed methods such as diffusion, epitaxial growth, etc. After the devices have been fabricated, the devices may be connected in a proper circuit pattern by suitable metal connectors, such as by forming an oxide film with openings and forming the desired connections over preselected portions of the surface.

Thereafter, the completed semiconductor structures may be divided into individual chips containing a number of devices in a circuit. These chips can be processed by known techniques and encapsulated or other fabrication steps performed prior to the completion of the final product.

A particular integrated circuit structure with insulating isolation of the invention will be described with reference to FIGURE 1 of the drawing. An integrated circuit structure 10 has a substrate 11 with an insulating glass layer 12 which surrounds a plurality of semiconductor devices 13, 14, 15 and 16. Each of the devices is in a discrete island isolated from each of the other islands. As shown in the drawing, transistors 13, 14 and 15 include emitter, base and collector regions. For example, transistor 15 has an emitter region 18, a base region 19, and a collector region 20. Likewise, resistor 16 has regions 27 and 28. The regions may be formed in the respective islands by conventional diffusion techniques. An advantage of the method and structure of the invention is that a number of devices may be formed simultaneously in different islands by the same diffusion steps. As a result, the electrical parameters of all such devices will be well matched to one another.

An oxide film 21 may then be formed over the surface of the structure and openings formed therein for the islands and devices. Connectors 22, 23, 24, 25 and 26 may be metalized over the surface of the oxide and through the openings of the proper regions of the devices to form the desired circuit.

Figure 2A:
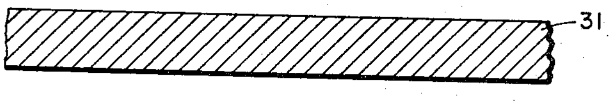

The basic steps in the fabrication of the integrated circuit of the invention will be illustrated in connection with FIGURE 2 of the drawing. As shown in FIGURE 2*a*, a wafer 31 is the starting material for the circuit structure of the invention. This wafer as mentioned above, is advantageously a single crystal silicon wafer which typically may be obtained from a larger crystal grown by a known crystal pulling or zone melting process. The larger crystal is sliced into wafers, and the wafers are lapped, polished and otherwise processed to make their major faces smooth and substantially parallel to each other.

Figure 2B:
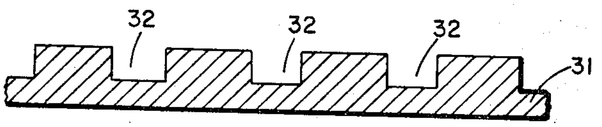

FIGURE 2*b* shows wafer 31 after cavities or channels 32 have been etched into the wafer. As pointed out above, the etching may be accomplished by forming a masking pattern over the surface of the wafer and then etching through the openings into the wafer using a suitable acid etching mixture.

Figures 2C, 2D:
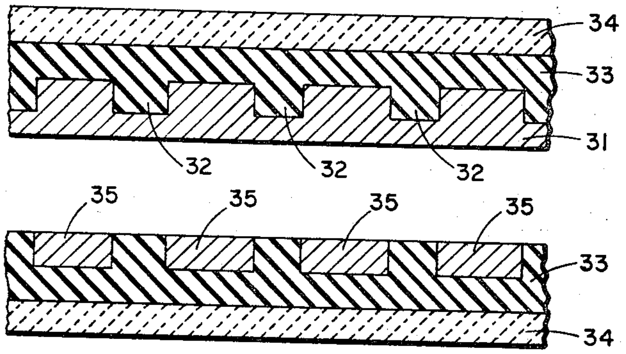

After the etching has been completed, a glass 33 is applied to the wafer filling the cavities 32 therein, and thereafter a dummy substrate 34 is combined with the glass and wafer and bonded thereto as shown in FIGURE 2*c*.

The outer or exposed surface of the wafer is removed to a depth sufficient to expose islands 35 and the glass channels surrounding each island in FIGURE 2*d* of the drawing. FIGURE 2*d* shows the structure in an inverted position as compared with its position in FIGURES 2*a*, *b* and *c*.

After the formation of the islands 35, the desired circuit devices may be fabricated therein to form transistors, diodes, resistors, capacitors, etc., and the devices connected by metallized contacts to form a circuit. These devices may be formed in the islands through opening in the oxide layer 21 and the devices connected by metallized contacts between the various portions of the devices and different devices in the same circuit. The exposed glass between the active devices also may be utilized to form thin film components such as resistors, capacitors, etc., by deposition onto the surface of the glass employing techniques known in thin film technology. Thereafter, the completed semiconductor structures may be divided into individual chips containing a number of devices and one or more circuits. These chips can then be processed by known techniques and encapsulated or other steps performed prior to the completion of the manufacture of the circuit structure.

The above description and drawings show that the present invention provides a new and improved semiconductor integrated circuit structure having improved isolation between discrete semiconductor islands. Furthermore, the present invention provides a semiconductor structure in which the parasitic capacitance between devices is substantially eliminated. The structure of the invention provides improved operating speed for switching transistors and circuits built into the structures. Moreover, the method of the invention for forming a semiconductor integrated circuit structure of the invention can be conducted economically on a mass production scale.

From the above description and drawings, it will be apparent that various modifications in the specific structures and procedures described in detail may be made within the scope of the invention. Therefore, the invention is not intended to be limited to the specific procedures and structures described except as may be required by the following claims.

We claim:

1. A method of manufacturing a semiconductor structure having discrete semiconductor islands, said method including
   forming a masking pattern with openings on a surface of a semiconductor wafer,
   etching through said openings into said wafer to provide cavities having an inside wall,
   applying a glass-containing mixtures to said etched surface of said wafer,
   fusion bonding a substrate to the glass-coated surface of said wafer by heating the substrate, glass-containing mixture and wafer combination to an elevated temperature,
   removing the opposite surface of said wafer to a depth sufficient to expose portions of said glass and thereby provide semiconductor islands, each surrounded by an isolating layer of glass over the sides and bottom thereof, said glass and said substrate having thermal expansion characteristics substantially the same as said semiconductor wafer.

2. A method of manufacturing a semiconductor structure having discrete semiconductor islands, said method including forming a masking pattern with openings on a surface of a semiconductor wafer,
   etching through said openings into said wafer to provide cavities having an inside wall,
   applying a glass-containing mixture to said etched surface of said wafer,
   applying a glass-containing mixture to a substrate,
   fusion bonding the glass-coated surface of said wafer to the glass-coated surface of said substrate, and
   removing the opposite surface of said wafer to a depth sufficient to expose portions of said glass and thereby provide semiconductor islands, each surrounded by an isolating layer of glass over the sides and bottom thereof, said glass and said substrate having thermal expansion characteristics substantially the same as said semiconductor wafer.

3. A method of manufacturing a semiconductor structure having discrete semiconductor islands, said method including
   forming a masking pattern with openings on a surface of a semiconductor wafer,
   etching through said openings into said wafer to provide cavities having an inside wall,
   applying a mixture comprising finely divided glass in a volatile diluent to said etched surface of said wafer,
   fusion bonding a substrate to the glass-coated surface of said wafer by heating the substrate, the wafer and the glass mixture to an elevated temperature, and
   removing the opposite surface of said wafer to a depth sufficient to expose portions of said glass and thereby provide semiconductor islands, each surrounded by an insulating layer of glass over the sides and bottom thereof, said glass and said substrate having thermal expansion characteristics substantially the same as said semiconductor wafer.

4. A method of manufacturing a semiconductor structure having discrete single crystal semiconductor islands, said method including
   forming a masking pattern with openings on a surface of a semiconductor wafer,
   etching through said openings into said wafer to provide cavities having an inside wall,
   applying a mixture comprising finely divided glass in a volatile diluent to said etched surface of said wafer,
   applying a mixture comprising finely divided glass in a volatile diluent to a substrate,
   heating said glass-coated wafer and said glass-coated substrate to remove diluent from said glass coatings,
   fusion bonding said glass-coated surface of said wafer to said glass-coated surface of said substrate by heating the combination to a temperature above about 1000° C., and
   removing the opposite surface of said wafer to a depth sufficient to expose portions of said glass and thereby provide semiconductor islands, each surrounded by an insulating layer of glass over the sides and bottom thereof, said glass and said substrate having thermal expansion characteristics substantially the same as said semiconductor wafer.

5. A method of manufacturing a semiconductor structure having discrete single crystal semiconductor islands, said method including
   forming a masking pattern with openings on a surface of a semiconductor wafer,
   etching through said openings into said wafer to provide cavities having an inside wall,
   applying a mixture comprising finely divided glass in a volatile diluent to said etched surface of said wafer,
   applying a mixture comprising finely divided glass in a volatile diluent to a substrate,
   heating said glass-coated wafer and said glass-coated substrate to remove diluent from said glass coatings, fusion bonding said glass-coated surface of said wafer to said glass-coated surface of said substrate by heating the combination to a temperature between about 1000° and 1400° C., removing the opposite surface of said wafer to a depth sufficient to expose portions of said glass and thereby provide semiconductor islands, each surrounded by an isolated layer of glass over the sides and bottom thereof, said glass and said substrate having thermal expansion characteristics substantially the same as said semiconductor wafer, fabricating discrete semiconductor devices in said islands, and providing metal contact and electrical connector means for each semiconductor device and for said semiconductor structure.

References Cited

UNITED STATES PATENTS

| | | | |
|---|---|---|---|
| 3,247,428 | 4/1966 | Perri | 317—234 |
| 3,290,753 | 12/1966 | Chang | 29—25.3 |
| 3,300,832 | 1/1967 | Cave | 29—25.3 |
| 3,312,879 | 4/1967 | Godijahn | 317—234 |

OTHER REFERENCES

"Electronics Review," vol. 37, No. 17, June 1, 1964, p. 23.

WILLIAM I. BROOKS, *Primary Examiner.*